United States Patent [19]
Rasmussen

[11] Patent Number: 6,068,750
[45] Date of Patent: *May 30, 2000

[54] FACEPLATES HAVING BLACK MATRIX MATERIAL

[75] Inventor: Robert T. Rasmussen, Boise, Id.

[73] Assignee: Micron Technology, Inc., Boise, Id.

[*] Notice: This patent is subject to a terminal disclaimer.

[21] Appl. No.: 09/234,003

[22] Filed: Jan. 19, 1999

Related U.S. Application Data

[60] Division of application No. 08/835,295, Apr. 7, 1997, which is a continuation-in-part of application No. 08/589,039, Jan. 19, 1996, Pat. No. 5,762,773.

[51] Int. Cl.[7] .............................. C25D 13/02; H01J 19/04
[52] U.S. Cl. .............................. 204/490; 445/24; 445/52; 313/496; 427/64; 427/157
[58] Field of Search .................................. 204/485, 486, 204/490, 491; 427/64, 157; 313/496; 445/24, 52

[56] References Cited

U.S. PATENT DOCUMENTS

| | | | |
|---|---|---|---|
| 3,500,102 | 3/1970 | Crost et al. | 313/109 |
| 3,665,241 | 5/1972 | Spindt et al. | 313/351 |
| 3,755,704 | 8/1973 | Spindt et al. | 313/309 |
| 3,812,559 | 5/1974 | Spindt et al. | 29/25.18 |
| 4,206,386 | 6/1980 | Akutsu et al. | 315/169.4 |
| 4,370,356 | 1/1983 | Bok et al. | 427/38 |
| 4,610,509 | 9/1986 | Sorimachi et al. | 350/339 |
| 4,626,739 | 12/1986 | Shmulovich | 313/469 |
| 4,682,162 | 7/1987 | Holloman | 340/799 |
| 4,701,789 | 10/1987 | Boyne | 358/65 |
| 4,846,556 | 7/1989 | Haneda | 350/317 |
| 4,891,110 | 1/1990 | Libman et al. | 204/181.1 |
| 4,923,421 | 5/1990 | Brodie et al. | 445/24 |
| 4,940,916 | 7/1990 | Borel et al. | 313/306 |
| 5,039,204 | 8/1991 | Choi | 359/67 |
| 5,129,850 | 7/1992 | Kane et al. | 445/24 |
| 5,147,743 | 9/1992 | Grossa | 430/7 |
| 5,157,527 | 10/1992 | De Keyzer et al. | 359/66 |
| 5,159,478 | 10/1992 | Akiyama et al. | 359/69 |
| 5,210,472 | 5/1993 | Casper et al. | 315/349 |
| 5,212,426 | 5/1993 | Kane | 315/169.1 |
| 5,229,331 | 7/1993 | Doan et al. | 437/228 |
| 5,270,079 | 12/1993 | Bok | 427/429 |
| 5,320,920 | 6/1994 | Isoda et al. | 430/7 |

(List continued on next page.)

OTHER PUBLICATIONS

Cathey, Jr., "Field Emission Displays," International Symposium on VLSI Technology Systems, and Applications, Proceedings of Technical Papers, May 31–Jun. 2, 1995, Taipei, Taiwan, pp. 131–136.

Cathey, Jr. "Field–Emission Displays," *Information Display* 11(10): 16–20, 1995 No Month Available.

Curtain, C., "The Field Emission Display: A New Flat Panel Technology," Conference Record of the 1991 International Display Research Conference, Oct. 15–17, 1991, pp. 12–15.

Lee, K. J., Current Limiting of Fields Emitter Array Cathodes, Georgia Institute of Technology Ph.D. Thesis, 1986, p. 162. No Month Available.

Yokoo et al., "Active Control of Emission Current of Field Emitter Array," *Revue Le Vide, les Couches Minces* (Supplement No. 271): 58–61, 1994. No Month Available.

*Primary Examiner*—Kishor Mayekar
*Attorney, Agent, or Firm*—Dorsey & Whitney LLP

[57] ABSTRACT

A black matrix material for increasing resolution and contrast of field emission displays is disclosed. The black matrix material is preferably deposited by electrophoresis in the interstitial regions between phosphor pixels of the faceplate. By this technique, high resolution and/or small surface area field emission displays may be manufactured. The black matrix material does not brown when subjected to the conditions associated with the manufacture of field emission displays, is chemically inert and remains stable under vacuum conditions and electron bombardment. The black matrix material is selected from boron carbide, silicon carbide, tungsten carbide, vanadium carbide and mixtures thereof.

22 Claims, 6 Drawing Sheets

U.S. PATENT DOCUMENTS

| | | | |
|---|---|---|---|
| 5,359,256 | 10/1994 | Gray | 313/169 |
| 5,399,238 | 3/1995 | Kumar | 156/643 |
| 5,477,105 | 12/1995 | Curtin et al. | 313/442 |
| 5,582,703 | 12/1996 | Sluzky et al. | 204/485 |
| 5,593,562 | 1/1997 | Vickers | 204/486 |
| 5,601,966 | 2/1997 | Kumar et al. | 430/313 |

FACEPLATES HAVING BLACK MATRIX MATERIAL

CROSS-REFERENCE TO RELATED APPLICATIONS

This application is a division of U.S. patent application Ser. No. 08/835,295, filed Apr. 7, 1997, which in turn is a continuation-in-part of U.S. application Ser. No. 08/589,039, filed Jan. 19, 1996, now U.S. Pat. No. 5,762,773.

STATEMENT OF GOVERNMENT INTEREST

This invention was made with Government support under Contract No. DABT63-93-C-0025 awarded by the Advanced Research Projects Agency (ARPA). The Government has certain rights in this invention.

TECHNICAL FIELD

This invention relates to the art of manufacture of field emission displays, and in a specific application, to the fabrication of patterned phosphor screens for high resolution displays. More specifically, the present invention relates to a black matrix material for such displays, and to a black matrix material which adheres to the interstitial regions between light-emitting phosphor pixels of a field emission display.

BACKGROUND OF THE INVENTION

Many devices, such as computers and televisions, require the use of a display screen. Some of these devices, such as laptop computers, require a lightweight, portable screen as a display screen. Currently, such screens typically use electroluminescent or liquid crystal display technology. A promising technology to replace these types of screens is the field emission display (FED).

Field emission displays typically include a generally planar substrate having an array of projecting emitters. In many cases, the emitters are conical projections integral to the substrate. Typically, the emitters are grouped into emitter sets where the bases of the emitters in each set are commonly connected.

A conductive extraction grid is positioned above the emitters and driven with a voltage of about 30–120 V. The emitter sets are then selectively activated by providing a current path from the bases to the ground. Providing a current path to ground allows electrons to flow from the emitters in response to the extraction grid voltage. If the voltage differential between the emitters and extraction grid is sufficiently high, the resulting electric field extracts electrons from the emitters.

Field emission displays also include display screens mounted adjacent the substrates. The display screens are formed from glass plates coated with a transparent conductive material to form an anode biased to about 1–2 kV. A cathodoluminescent layer covers the exposed surface of the anode. The emitted electrons are attracted by the anode and strike the cathodoluminescent layer, causing the cathodoluminescent layer to emit light at the impact site. The emitted light then passes through the anode and the glass plate where it is visible to a viewer.

The brightness of the light produced in response to the emitted electrons depends, in part, upon the rate at which electrons strike the cathodoluminescent layer, which in turn depends upon the magnitude of current flow to the emitters. The brightness of each area can thus be controlled by controlling the current flow to the respective emitter set. By selectively controlling the current flow to the emitter sets, the light from each area of the display can be controlled and an image can be produced. The light emitted from each of the areas thus becomes all or part of a picture element or "pixel." For a general overview of FED technology, see D. A. Cathey, Jr., *"Field Emission Displays," Information Display* Vol. 11, No. 10, pp, 16–60. October 1995, incorporated herein by reference in its entirety).

The manufacture of a FED presents several technical challenges. For example, application of phosphor to a conductive surface may involve the use of photoresist masks, as described in, for example, U.S. Pat. No. 4,891,110 to Libman et al., which patent is incorporated herein in its entirety by reference. The use of this photoresist mask may cause some problems. As described in Libman et al., the photoresist is fixed in certain areas over a conductive surface, the unfixed photoresist is then removed by a wash (using, for example, water) and the exposed conductive surface is subjected to a cataphoretic bath to apply a phosphor to the conductive surface. After that application, the fixed photoresist material must be removed, which is accomplished in the field emission display art by way of washing with, for example, a hydrogen peroxide solution. Such washing involves mechanical agitation, which can dislodge particles of phosphor, resulting in unacceptable displays. This quality problem becomes even more critical as phosphor spot size or line width shrinks to achieve higher resolutions products.

To provide contrast in ambient light, a dark matrix material may be placed in the interstitial regions between the phosphor pixels. Unfortunately, many potential matrix materials have significant disadvantages when utilized under conditions associated with the manufacture of an FED. For example, di-aqueous graphite (DAG) tends to burn when heated in the presence of oxygen. Furthermore, DAG is conveniently used only in a bake-on/lift-off process, which is not feasible for use in the manufacture of high resolution or small area FEDs. Manganese carbonate, which is light in color upon initial deposit onto a display, tends to turn brown when subjected to elevated temperature under vacuum conditions (see Libman et al.). Such browning of manganese carbonate adversely effects contrast of the FED.

Accordingly, there is a need for a method and system for manufacture of field emission displays that will not mechanically agitate the phosphor during removal of photoresist material. Furthermore, there is a need in the art for a matrix material which remains black after being subjected to conditions associated with FED manufacture, particularly at elevated temperatures under vacuum. There is also a need for a black matrix material which may be applied by deposit techniques suitable for FED manufacture. The present invention fulfills these needs and provides further related advantages.

SUMMARY OF THE INVENTION

According to one embodiment of the present invention, a method is provided for producing high resolution displays. In brief, the present invention is directed to a black matrix material for adherence to the interstitial regions between light-emitting phosphor pixels of a field emission display. The black matrix material is selected from boron carbide, silicon carbide, tungsten carbide, vanadium carbide, and mixtures thereof. Such materials remain black when subjected to FED manufacturing conditions, and are both chemically inert and stable, making them particularly well suited within the practice of this invention.

In one embodiment of this invention, a method for manufacturing a faceplate for an FED is disclosed. The method involves depositing, preferably electrophoretically, the black matrix material on at least a portion of the faceplate. Prior to deposit, the faceplate may be patterned with a photoresist to expose only those areas of the faceplate on which the black matrix material is to be deposited. After depositing the black matrix material, the photoresist may be removed. A new photoresist is then patterned to expose only those areas of the faceplate on which the phosphor is to be deposited, followed by depositing phosphor in those exposed areas. After deposit of the black matrix material and phosphor, an appropriate binder may be employed, followed by successive baking steps. The resulting faceplate may then be used in the assembly of an FED.

In another embodiment, a method is disclosed for depositing a black grille on a faceplate of an FED by contacting the faceplate with an electrophoresis solution containing the black matrix material, and electrophoretically depositing the black matrix material on at least a portion of the faceplate. In this embodiment, the faceplate may again be patterned with a suitable photoresist prior to deposition of the black matrix material.

In another embodiment, a composition for electrophoretically depositing a black grille on a faceplate is disclosed, wherein the composition comprises the black matrix material, and preferably one or more of an electrolyte, an anti-agglomerating agent and a solvent In still a further embodiment, a faceplate having a black matrix material deposited thereon, as well as an FED comprising such a faceplate, are disclosed. Also disclosed are faceplates and FEDs made according to the above methods.

In yet another embodiment, a screen is disclosed. The screen comprises a substrate; a conductive layer carried by said substrate and covering a portion of said substrate; and a cathodoluminescent layer carried by said substrate and overlaying a region of said conductive layer. The cathodoluminescent layer includes: a first region defining a plurality of non-contiguous sub-regions, and a second region interstitial said sub-regions; said first region comprising light emissive substance and said second region comprising black matrix material.

Another embodiment of the invention provides for a field emission display. The field emission display comprises: an extraction grid having a plurality of openings; an emitter substrate including a plurality of emitters aligned with said plurality of openings; and a screen adjacent said extraction grid. The screen comprises: a substrate; a conductive layer carried by said substrate and covering a portion of said substrate; and a cathodoluminescent layer carried by said substrate and overlaying a region of said conductive layer. The cathodoluminescent layer comprises: a first region defining a plurality of non-contiguous sub-regions, and a second region interstitial said sub-regions; said first region comprising light emissive material and said second region comprising black matrix material; said sub-regions aligned to respective emitters.

In another embodiment of the invention, there is provided a display device. The display device comprises: a video signal generator capable of generating an image signal (e.g., a television or camcorder); an electronic controller driven by an image signal from said video signal generator, said electronic controller controlling an array of emitter control circuits; an emitter substrate including an array of emitters, said emitter control circuits individually coupled to individual emitters; an extraction grid having a plurality of openings, said openings aligned with said array of emitters; and a screen adjacent said extraction grid. The screen comprises a substrate; a conductive layer carried by said substrate and covering a portion of said substrate; and a cathodoluminescent layer carried by said substrate and overlaying a region of said conductive layer. The cathodoluminescent layer includes: a first region defining a plurality of non-contiguous sub-regions, and a second region interstitial said sub-regions; said first region comprising phosphor pixels and said second region comprising black matrix material.

These and other aspects of this invention will become apparent upon reference to the attached figure and the following detailed description.

BRIEF DESCRIPTION OF THE DRAWINGS

For a more complete understanding of the present invention and for further advantages thereof, reference is made to the following Detailed Description taken in conjunction with the accompanying drawings, in which.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
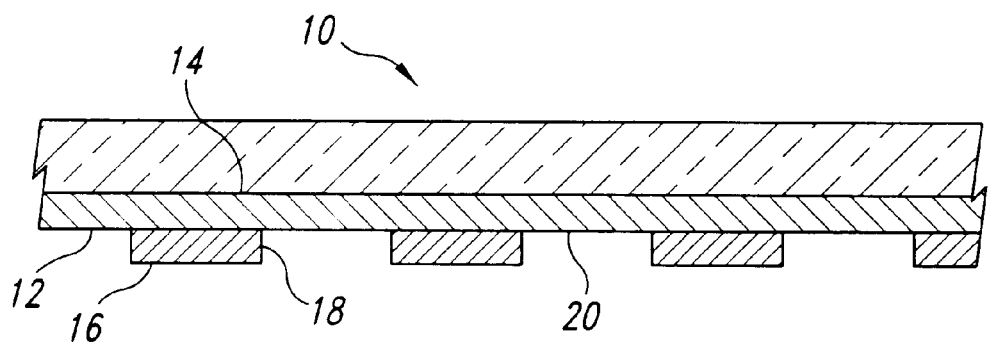
FIG. 1 is a sectional, side elevation, diagrammatic view of an embodiment of the present invention near the start of processing.

Referring now to FIG. 1, an embodiment of the present invention will be described in which a method for producing high resolution displays is provided. The method comprises forming a faceplate 10 by: depositing an electrically conductive coating (to provide an electrically conductive layer) 12 over a screening surface 14; shielding the electrically conductive coating/layer 12 with a grille 16 formed of black matrix material and having a set of holes 18 formed therein exposing a matrix of areas 20 on the electrically conductive coating/layer 12. The grille may be formed in much the same manner as a phosphor coating, namely, coating with a resist, soft baking, exposing, developing, and depositing the grille material. According to alternate embodiments, non-conductive coatings are used. Also, according to another embodiment, no such conductive layer is used, and a grille is applied directly to a screen (also referred to as the substrate). As used herein, the term "screen layer" defines either the screen or a layer applied to the screen, such as electrically conductive coating 12.

Figure 2:
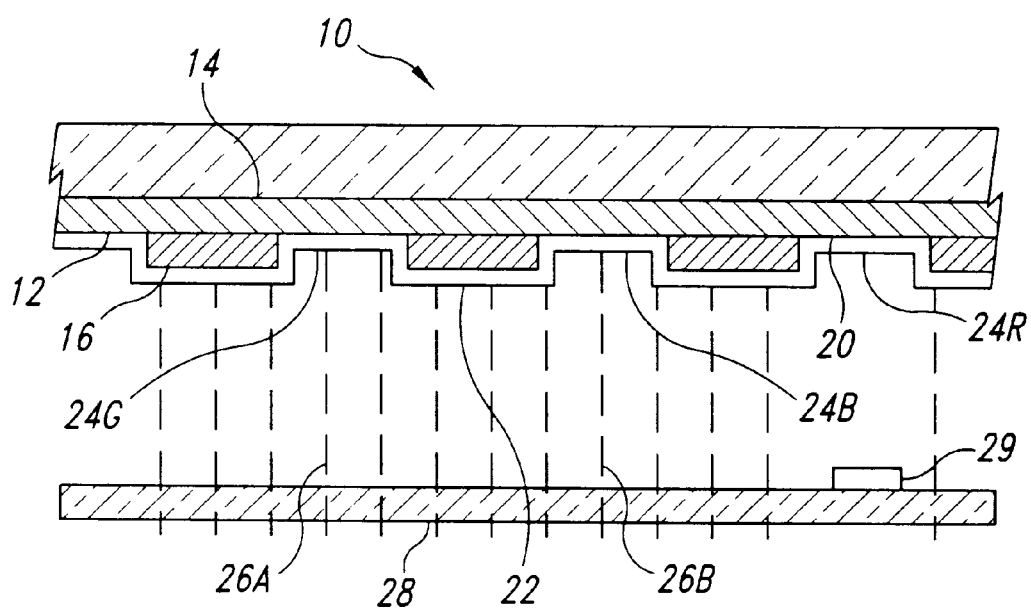
FIG. 2 is a sectional, side elevation, diagrammatic view of the embodiment of FIG. 1 at a further stage of processing.

Referring now to FIG. 2, the process further comprises applying a layer 22 of insulative photoresist to the grille 16 and the areas 20 of electrically conductive coating/layer 12 exposed by the grille; fixing sets of areas 24G and 24B of photoresist-covered areas, whereby fixed sets of area 24G and 24B and an unfixed set of areas 24R are defined. According to the embodiment shown, the fixing is accomplished by shining ultraviolet light 26 through a mask 28, which is similar to a semiconductor lithography mask. These masks may be made of quartz (or glass) and have opaque layer 29 on them (such as chrome oxide or black chrome) to set a pattern, as is known to those skilled in the art. Alternative methods of fixing include the use of a positive photoresist, where the fixing comprises application of the photoresist and light is applied to the areas where it is desired that the photoresist be unfixed.

Figure 3:
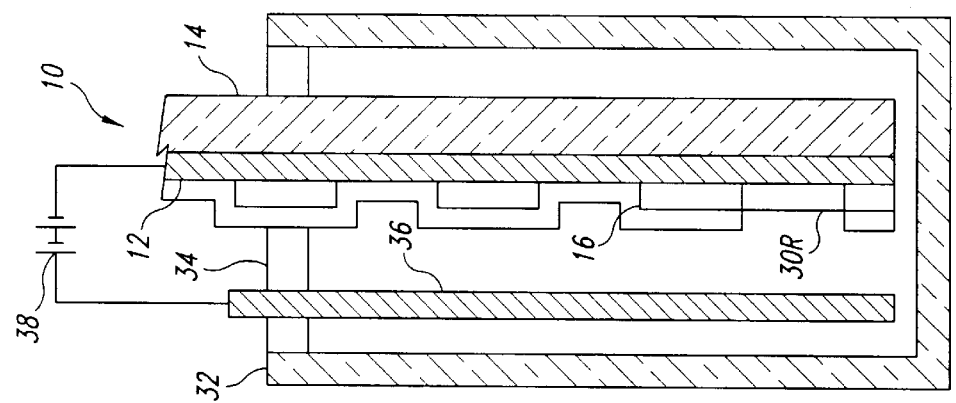
FIG. 3 is a sectional, side elevation, diagrammatic view of a cataphoretic deposition device useful according to one example embodiment of the present invention.

Referring now to FIG. 3, the process further comprises: removing the photoresist from the unfixed set; and depositing a light-emitting substance 30R on the exposed-conductive area. According to one embodiment, the depositing is accomplished through cataphoretic deposition as known to those of skill in the art. The illustrated tank 32 is filled with an appropriate electrolyte 34 and contains an electrode 36 connected to a power supply 38, which is also connected to the electrode of the faceplate 10.

According to a more specific embodiment, the light-emitting substance 30R comprises a phosphor, which may be one or more of the following: zinc silicate—manganese; zinc sulphide—copper; zinc beryllium silicate—manganese; zinc sulphide—silver and zinc cadmium sulphide—silver; calcium tungstate; zinc sulphide—silver and zinc cadmium sulphide—copper; calcium pyrophosphate; potassium chloride (dark trace—nonluminescent—called a Scotophor); zinc sulphide—silver; zinc magnesium fluoride—manganese; magnesium silicate—manganese; zinc oxide; calcium magnesium silicate—cerium; zinc oxide and zinc cadmium sulphide—copper; calcium magnesium silicate—titanium and calcium beryllium silicate—manganese; potassium magnesium fluoride—manganese; zinc cadmium sulphide—silver; magnesium fluoride—manganese; zinc sulphide—silver, zinc silicate—manganese, zinc phosphate—manganese; zinc sulphide—silver, zinc cadmium sulphide—cadmium sulphide—silver; zinc sulphide—silver, zinc cadmium sulphide—vanadate—europium zinc sulphide—silver, zinc cadmium sulphide—oxysulphide—europium; zinc sulphide—silver, zinc cadmium sulphide—oxide—europium; zinc sulphide—silver, zinc cadmium sulphide—copper, yttrium oxysulphide—europium; zinc oxide; calcium silicate—lead—manganese; zinc phosphate—manganese; zinc cadmium sulphide—copper; zinc sulphide—copper, calcium magnesium silicate—titanium zinc cadmium sulphide—copper; zinc sulphide—lead—copper; zinc sulphide selenite—silver; zinc sulphide—silver—nickel; zinc cadmium sulphide—silver—nickel; zinc magnesium fluoride—manganese; zinc silicate—manganese—arsenic; zinc sulphide—silver zinc cadmium sulphide—copper; zinc magnesium fluoride—manganese calcium magnesium; silicate—cerium; zinc sulphide—copper—zinc silicate—manganese—arsenic; gadolinium oxysulphide—terbium; lanthanum oxysulphide—terbium; yttrium oxysulphide—terbium; yttrium aluminate—cerium; yttrium silicate—cerium; Penetron phosphor/yttrium vanadate—europium (Red) (10 KeV), zinc silicate—manganese (green) (17 eV); Penetron phosphor—red @8 keV, green @15 keV; Penetron phosphor—red @6 keV, green @12 keV; zinc silicate—titanium; yttium gallium aluminum garnet—terbium; yttrium oxysulphide—terbium zinc cadmium sulphide—copper; zinc sulphide—silver; and yttrium oxide—europium.

It is fully within the scope of the present invention to apply a binder material to the substrate in order to firmly attach the light emitting substance, e.g., phosphor, and grille material to the substrate. A suitable binder would be a 1% by weight solution of an organo-silicate, such as TECHNI-GLAS GR650F, in isopropanol or other suitable solvent. This could be applied by a puddle or spray application, or other suitable method, with the substrate then being spun dry at approximately 1000 RPM.

It would also be within the scope of the invention to eliminate the organic materials (which could include the binder or components thereof from the screen/substrate. These organic materials may be eliminated by a baking operation. If the organic materials are not baked out, then there may be problems with carbon contamination which could adversely affect the future performance of the phosphor. The preferred baking would be done in a suitable oven ramped to 650–700° C. at a rate the substrate can handle without breaking. The parts need be held at temperature for only about 10 minutes to 3 hours, preferably about 30 minutes in order to eliminate substantially all of the organic materials, and thereafter are cooled and removed from the oven.

Figure 4:
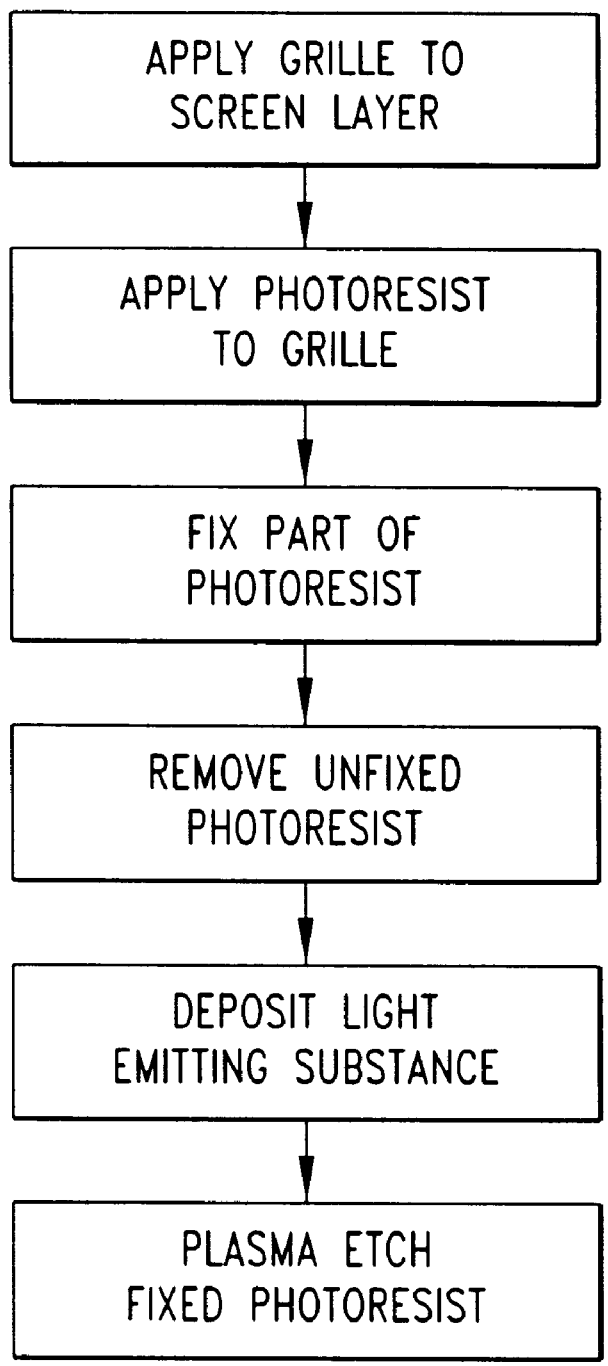
FIG. 4 is a flow chart of a process provided according to one aspect of the present invention.

Referring now to FIG. 4, which shows the process flow in block diagram form, the process further comprises plasma etching the fixed set 24G and 24B of insulative photoresist. Examples of acceptable etchers include either barrel type or parallel plate etchers, as are known by those skilled in the art.

Figure 5A:
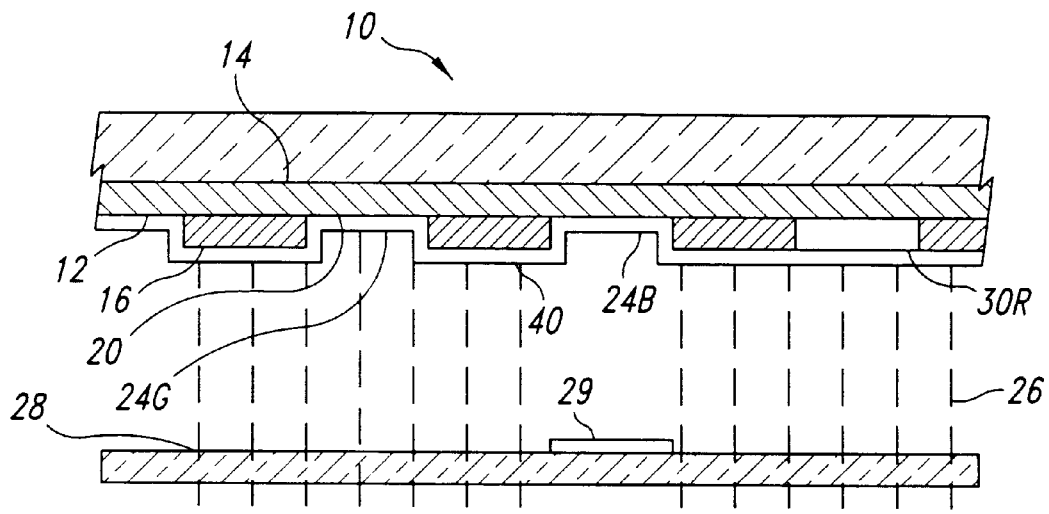
FIGS. 5A and 5B are sectional, side elevation, diagrammatic views of the embodiment of the present invention in a still further stage of processing.
Figure 5B:
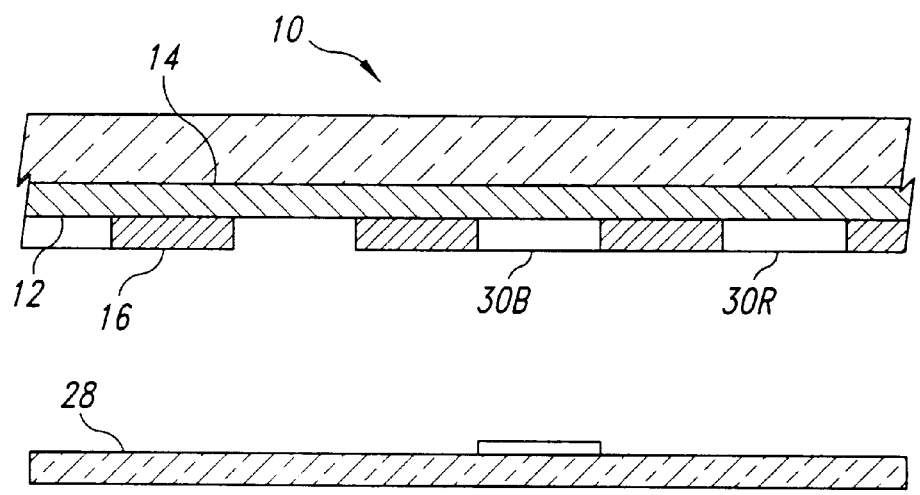

Referring now to FIGS. 5A and 5B, the method further comprises applying a layer 40 of insulative photoresist (for example, an OCG SC series photoresist) to the entire substrate and fixing the photoresist in all areas except 24B of the insulative photoresist covering the exposed-conductive area 20. Using, for example, a gentle wash with developer appropriate for photoresist, the unfixed portion of the insulative photoresist covering is then removed, and a second color light emitting substance 30B is deposited on the exposed-conductive area, as discussed above with respect to the first color light emitting substance. Acceptable techniques for applying layer 40 include, for example, meniscus coating, spin coating, curtain coating, and other methods that will occur to those skilled in the art such as cataphoretic deposition. Phosphors useful with various means of application will be understood by those of skill in the art from the present description.

Figure 6A:
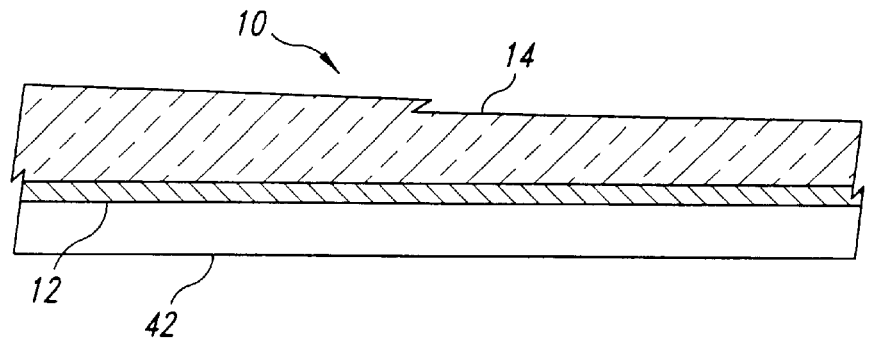
FIGS. 6A to 6C are sectional, side elevation, diagrammatic views of an embodiment of the present invention for forming the grille.
Figure 6B:
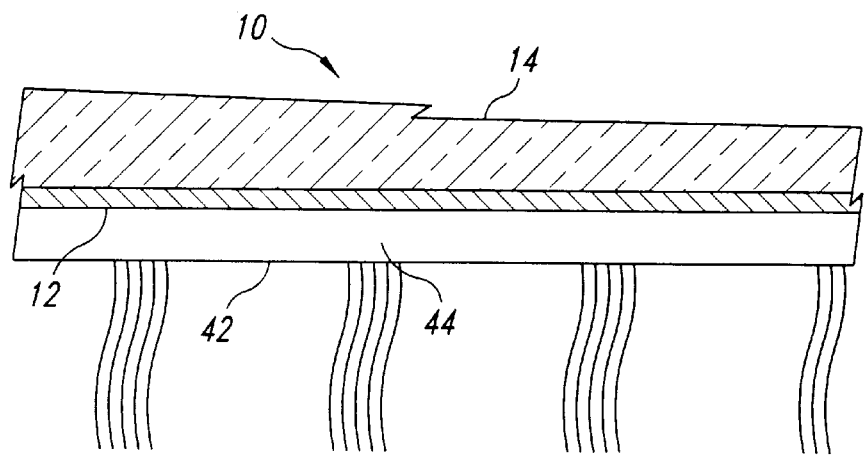
Figure 6C:
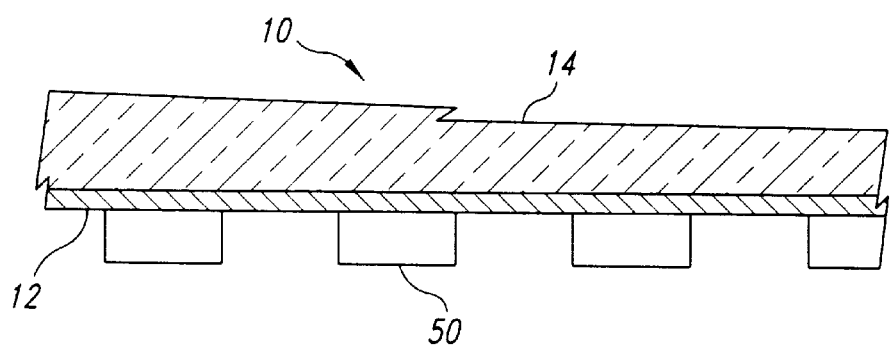

Referring now to FIGS. 6A–6C, an acceptable method for forming grilles, having a patterned array of holes therein, will be described. According to this method, the forming comprises: applying a layer 42 of insulative photoresist to the electrically conductive coating/layer 12; fixing one set 44 of photoresist-covered conductive areas; and removing the unfixed photoresist with, for example, a gentle wash with developer appropriate for the photoresist used (for example, Waycoat Negative Photoresist Developer for SC resists made by OCG).

Figure 7:
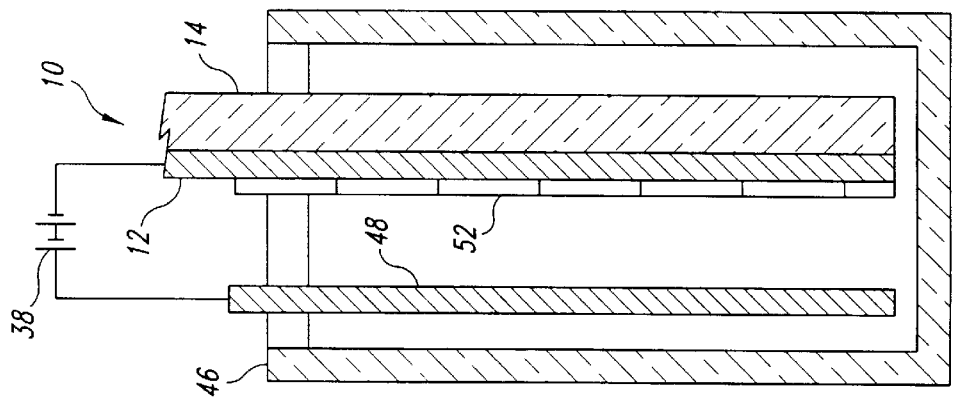
FIG. 7 is a sectional, side elevation, diagrammatic view of another cataphoretic deposition device useful with the embodiment of the FIGS. 6A to 6C.

Referring now to FIG. 7, the faceplate 10 is subjected to a cataphoretic bath 46, wherein a potential is developed between the conductive coating/layer 12 and electrode 48, which comprises, in this example, stainless steel. As a result, the grille 52 forms on the conductive coating/layer (it may also be referred to as a "surface") 12 where the unfixed photoresist was removed. The fluid used in the cataphoretic bath 46 comprises, for example, about 99.7% by weight of vehicle (for example, isopropyl alcohol) no more than 0.02% by weight electrolyte (for example, lanthanum nitrate hexahydrate), about 0.05 to 0.10% by weight glycerol, and a powder phosphor or a light-absorbing (also referred to as "black matrix") material. Up to 1% water can be added to the phosphor or light absorbing material.

Thus, by the methodology described above, and by methodology described below in connection with FIG. 8, the present invention provides a black matrix material for adherence to the interstitial regions between light-emitting pixels of a faceplate. The preferred black matrix material of this invention is black when deposited on the faceplate, and does not require subsequent heating to render it opaque. Moreover, when the black matrix material of this invention is subjected to process conditions associated with FED manufacture (including heat cycles under various atmospheres and vacuum), the matrix material does not change color. The black matrix material of the present invention is chemically inert and remains stable in vacuum conditions under electron bombardment, and thus does not outgas or chemically decompose during FED manufacture. Furthermore, the black matrix material functions as a black body by absorbing all wavelengths (particularly the visible spectrum) of incident radiant energy. Thus, the black matrix material provides excellent contrast by not reflecting incident light in the visible range. The black matrix material may also be referred to as a light-absorbing material, and may serve to block light emitted from a first of adjacent pixels from reaching a second of adjacent pixels.

Figure 8:
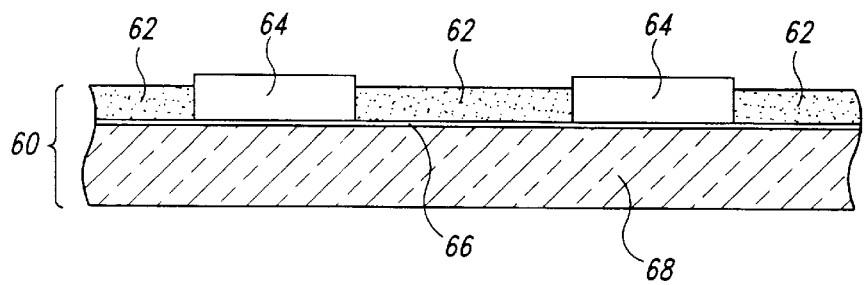
FIG. 8 is a cross-sectional view of a representative FED faceplate of this invention illustrating the location of the black matrix material in relation to the phosphor pixels, conductive layer and faceplate substrate.

Referring now to FIG. 8, a representative FED faceplate 60 of this invention is depicted. Black matrix material 62 (indicating symbolically by the stippling) is located within the interstitial regions between the light emitting substance (e.g., phosphor pixels) 64. Both the black matrix material and the pixels are in contact with conductive coating/layer 66, which in turn is in contact with faceplate substrate 68. The conductive coating/layer may be indium-tin oxide or tin oxide, and the faceplate substrate may be glass, or maybe formed of the materials disclosed above. The pixels may be formed of phosphor materials such as those disclosed above. It will be understood by one skilled in this field that the pixels may be arranged in any number of patterns on the faceplate, and that pixels of multiple colors (e.g. a triad of red, green and blue) may be employed to generate color images. The black matrix material located between the pixels collectively forms the "grille", and the term black matrix material is used herein interchangeably with the terms grille material and light-absorbing material.

Suitable black matrix materials for this invention include, without limitation, manganese carbonate, cobalt oxide black, iron oxides mixed with cobalt oxides, boron carbide, lead (IV) oxide, niobium (II) oxide, niobium (IV) oxide, palladium (II) oxide, rhenium (IV) oxide, tungsten carbide, silicon carbide, vanadium carbide, copper oxide, boron silicide, chrome (II) oxide, germanium oxide, iridium oxide, titanium oxide, manganese carbide, manganese phosphide, manganese tantalate, osmium oxide, strontium boride, strontium carbide, thorium silicide, molybdenum (II) oxide, molybdenum (III) oxide, molybdenum sulfide, and praseodymium manganese oxide. Boron carbide, titanium carbide, silicon carbide, vanadium carbide and mixtures thereof are preferred black matrix materials. In a preferred embodiment, the black matrix material is vanadium carbide. Such material is commercially available in the form of a fine powder from a number of suppliers, such as Aldrich Chemical Co. Inc. (Milwaukee, Wis.) and Alfa Aesar (Bologna, Italy).

Particles of black matrix material having a diameter of about three microns or less generally do not require milling before use (as disclosed in further detail below). However, particles larger than about three microns are preferably milled to a smaller particle size, or separated and removed from the powdered material prior to use. The black matrix material may then be formulated in an appropriate manner for depositing the same in the interstitial regions between the light-emitting phosphor pixels of the FED faceplate by, for example, cataphoretic bath as described above or other electrophoretic process, screen printing, dusting or a slurry method.

In the case of high resolution FEDs, and FEDs of small surface area, the black matrix material is preferably deposited electrophoretically. In this embodiment, an electrophoresis solution is made containing the black matrix material, and preferably also contains one or more of an electrolyte, an anti-agglomerating agent and a solvent. A suitable suspension may contain from about 0.03–1.0 wt % of the black matrix material (powdered form), about 0.001–0.2 wt %, preferably about 0.02 wt % of the electrolyte, from about 0.03 to 1.0 wt % of the anti-agglomerating agent, and solvent (also referred to as vehicle). Water may optionally be present up to about 2 wt % to favorably modify the deposition parameters and/or deposited layer quality. This solution may then be utilized to deposit the black matrix material using conventional electrophoresis techniques, such as that disclosed in U.S. Pat. No. 4,891,110 (which is incorporated herein by reference in its entirety). In this context suitable electrolytes include (but are not limited to) lanthanum nitrate hexahydrate, magnesium nitrate hexahydrate, aluminum nitrate nonahydrate, thorium nitrate dodecahydrate and cerium nitrate hexahydrate and indium nitrate pentahydrate. Anti-agglomerating agents include (but are not limited to) glycerol and other polyhydric alcohols. Suitable solvents include (but are not limited to) organic solvents such as alcohols and ketones. Solvents with dielectric constants between 12 and 25 are Generally most suitable, and isopropanol is a preferred solvent.

In manufacturing an FED utilizing the black matrix material of this invention, the FED faceplate is preferably patterned with photoresist leaving open areas where the black matrix material is to be deposited. Suitable photoresists, as well as methods for coating, softbaking, exposing (to pattern the areas for deposit of black matrix material), and developing have been described above and/or are well known to those skilled in this field. The patterned photoresist layer must be insulative and compatible with subsequent processing. For example, the electrophoresis method for depositing the black matrix material within the openings formed by the photoresist has two major steps: 1) particle transport to the cathode, and 2) electrochemical reaction of electrolyte at the cathode. The electrochemical reaction fixes the black matrix material to the substrate, and only occurs on parts of the substrate which are exposed to the solution and in electrical contact with the circuit. Therefore the resist has to cover areas not to be coated, and provide a cover that has sufficient insulation to prevent the electrochemical reaction from taking place. The resist must be compatible with subsequent processing, so that it will not react or dissolve in the electrophoretic bath, and it must not fail under the electric potential generated by the electrophoresis reaction.

The voltage applied for electrophoresis is between about 100 volts and about 200 volts, with a current at about $0.01 \times 10^{-3}$ amperes per square centimeter. The specific resistance of the bath is between about $5 \times 10^5$ and about $1.0 \times 10^6$ ohms per centimeter. The application of insulative grilles in the above-described manner provides for holes in the fixed set of photoresist-covered conductive areas.

After deposit of the black matrix material, the photoresist may be removed by known techniques, and the process repeated to deposit the phosphor. More specifically, the photoresist is stripped, and then the faceplate having the black matrix material deposited thereon is again coated with photoresist, softbaked, exposed (to pattern the areas for phosphor deposit), and developed. The phosphor is then deposited within the open areas of the photoresist by, for example, electrophoresis, resulting in a faceplate having phosphor pixels and a black matrix material in the interstitial regions between the pixels.

A preferred subsequent treatment of the FED faceplate includes application of an appropriate binder to the black matrix material and phosphor. Suitable binders in this regard include (but are not limited to) organo-silicates. colloidal silica and silicates. The organo-silicate binder will subsequently need to be baked at high temperatures to remove the carbon, as discussed above. For FED faceplates which cannot readily tolerate these high baking temperatures, it is preferred to use the colloidal silica and silicates as the binder, as they cure at essentially room temperature.

Next, photoresist may be removed by plasma etching, conducted as is known to those of skill in the art. However, according to some specific embodiments of the invention, the photoresist used should be chosen such that it does not leave a residual ash after plasma etching. The following are believed or known to be acceptable: polyisoprene based photoresists, polyvinyl alcohol-based photoresists, some polyimide based resists and some negative chemically amplified resists.

During the plasma etching, it is acceptable to use a pressure of about 1 Torr, power of between about 400 to about 500 watts, in a gas atmosphere of: air, oxygen/nitrogen mixture, or any other suitable gases for stripping the photoresist. Other examples known or believed to be effective include oxygen and hydrogen/argon mixtures.

Process time during the etch is, according to some embodiments, about 30 minutes, but this time varies depending upon etch process parameters and the particular photoresist used. It will be recognized that changes may be made in the above-described example embodiments without departing from the spirit and scope of the present invention.

Figure 9:
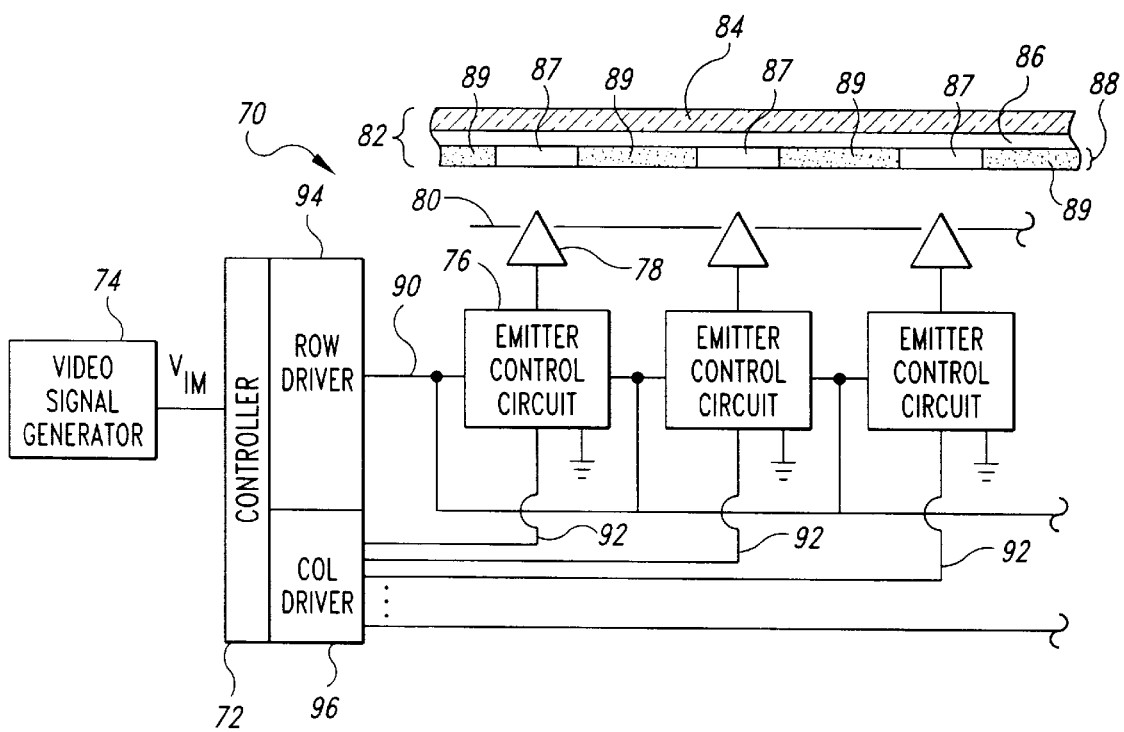
FIG. 9 is a block diagram of a portion of a field emission display according to the preferred embodiment of the invention showing a group of three emitters controlled by respective column and row driver circuits.

A flat panel display may be prepared from the faceplate(s) of the invention described above. As shown in FIG. 9, a display device 70, which may be a television, computer display, or similar device, includes an electronic controller 72 driven by an image signal $V_{IM}$ from a video signal generator 74. The video signal generator 74 may be, for example, a television receiver, a computer, a camcorder, a VCR, etc. In response to the image signal $V_{IM}$ the controller 72 controls an array of emitter current control circuits 76, each coupled to a respective emitter 78. Although a single emitter 78 is coupled to each emitter control circuit 76 in FIG. 9, it will be understood that the emitter 78 may represent a set of commonly connected emitters. The current through each emitter 78 can be controlled independently, because a separate control circuit 76 couples to each emitter 78. While the array is represented by only three control circuits 76 and emitters 78 for clarity of presentation, it will be understood that typical arrays include several hundred control circuits 76 and sets of emitters 78 arranged in rows and columns.

The emitters 78 are aligned with respective openings in an extraction grid 80 adjacent a screen 82. The extraction grid 80 is a conventional extraction grid formed as a planar conductor having several holes, each aligned with a respective emitter 78. The screen 82 is a conventional screen formed from a glass plate 84 coated with a transparent, conductive anode 86 which is coated, in turn, by a cathodoluminescent layer 88. The cathodoluminescent layer 88 is formed from a first region defining a plurality of non-contiguous sub-regions 87, and a second region 89 interstitial (i.e., between, surrounding, covering the areas between) the sub-regions 87. The sub-regions (and hence the first region) comprises a light emissive substance/material (e.g., phosphor), while the second region comprises black matrix material, ie., forms the grille as described herein.

During typical operation, the extraction grid 80 is biased to approximately 0–100 V and the anode 86 is biased to approximately 1–2 kV. A row driver 94 and column driver 96 within the controller 72 activate selected ones of the emitters 78 by selectively controlling the respective control circuits 76 through row lines 90 and column lines 92. The control circuits 76 activate the emitters 78 by connecting the emitters 78 to a bias voltage or ground which allows electrons to flow to the emitters 78. The extraction grid 80 extracts the provided electrons by creating a strong electric field between the extraction grid 30 and the emitter 78. In response, the emitter 78 emits electrons that are attracted by the conductive coating/layer 86. The electrons travel toward the layer 86 and strike the cathodoluminescent layer 88, causing light emission at the impact site. Because the intensity of the emitted light corresponds in part to the number of electrons striking the cathodoluminescent layer 88 during a given activation interval, the intensity of light can be controlled by controlling electron flow to the emitters 78.

The invention thus provides a screen comprising: a substrate; a conductive layer carried by said substrate and covering a portion of said substrate; and a cathodoluminescent layer carried by said substrate and overlaying a region of said conductive layer, where said cathodoluminescent layer includes: a fist region defining a plurality of non-contiguous sub-regions, and a second region interstitial said sub-regions; said first region comprising light emissive substance and said second region comprising black matrix material.

The invention additionally provides a field emission display comprising: an extraction grid having a plurality of openings; an emitter substrate including a plurality of emitters aligned with said plurality of openings; a screen adjacent said extraction grid, said screen comprising: a substrate; a conductive layer carried by said substrate and covering a portion of said substrate; and a cathodoluminescent layer carried by said substrate and overlaying a region of said conductive layer; said cathodoluminescent layer comprising: a first region defining a plurality of noncontiguous sub-regions, and a second region interstitial said sub-regions; said first region comprising light emissive material and said second region comprising black matrix material; said sub-regions aligned to respective emitters.

According to another embodiment of the invention, a display device is provided, where the display device comprises: a video signal generator capable of generating an image signal; an electronic controller driven by an image signal from said video signal generator, said electronic controller controlling an array of emitter control circuits; an emitter substrate including an array of emitters, said emitter control circuits individually coupled to individual emitters; an extraction grid having a plurality of openings, said openings aligned with said array of emitters; a screen adjacent said extraction grid, said screen comprising: a substrate; a conductive layer carried by said substrate and covering a portion of said substrate; and a cathodoluminescent layer carried by said substrate and overlaying a region of said conductive layer; said cathodoluminescent layer including: a first region defining a plurality of non-contiguous sub-regions, and a second region interstitial said sub-regions; said first region comprising phosphor pixels and said second region comprising black matrix material.

According to another embodiment of the present invention, a method is provided for producing high resolution displays, the method comprising: depositing an electrically conductive coating over a screening surface; shielding the electrically conductive coating with a grille having a set of holes formed therein exposing a set of areas of the electrically conductive coating; applying a layer of insulative photoresist to the grille and the exposed areas of electrically conductive coating, whereby a plurality of photoresist-covered conductive areas are defined; fixing one set of the plurality of photoresist-covered conductive areas, whereby a fixed set is defined, and an unfixed set is defined; removing the photoresist from the unfixed set; depositing a light emitting substance on the exposed-conductive area; and plasma etching the fixed set of insulative photoresist.

According to a further embodiment of the invention, a system for producing high resolution displays is also provided. The system comprising: depositor of an electrically conductive coating over a screening surface; depositor of a grille having a set of holes formed therein applied to the screening surface; depositor of a grille having a set of holes formed therein applied to the screening surface and exposing a set of areas of the electrically conductive coating; applicator of a layer of insulative photoresist to the grille and the exposed areas of electrically conductive coating, whereby a plurality of photoresist-covered conductive areas are defined; fixer of one set of the plurality of photoresist-covered conductive areas, whereby a fixed set is defined, and an unfixed set is defined; remover of the photoresist from the unfixed set; depositor of a light emitting substance on the exposed-conductive area; and plasma etcher of the fixed set of insulative photoresist.

According to another embodiment of the invention, a method ("Method 1") is provided for producing high resolution displays. Method 1 comprises the steps of: applying a grille to a screen layer, the grille having a set of holes formed therein exposing an exposed set of areas of the screen layer; applying a layer of photoresist to the grille and the exposed areas of the screen layer, whereby a plurality of photoresist-covered screen layer areas are defined; fixing one set of the plurality of photoresist-covered screen layer areas, whereby a fixed set is defined, and an unfixed set is defined; removing the photoresist from the unfixed set; depositing a light emitting substance on the exposed areas of the screen layer, and plasma etching the fixed set of photoresist.

Preferably, Method 1 further comprises depositing an electrically conductive coating over a screening surface (to provide Method 2). Preferably, said plasma etching of the photoresist to define an exposed-conductive area (as set forth in Method 2), and said depositing a light emitting substance on the exposed-conductive area (as also set forth in Method 2) comprises depositing a first color light emitting substance and defining a first deposit area, the method further comprising: applying a layer of photoresist to the exposed-conductive area and the entire substrate; fixing the photoresist everywhere except where phosphor is to be deposited; removing the unfixed portion of the photoresist covering; and depositing a second color light emitting substance on the exposed-conductive area (so as to provide Method 3). Preferably, said fixing one set according to Method 3 comprises: exposing all areas of the photoresist-covered conductive areas that are not to be deposited on to light (so as to provide Method 4). Preferably, said exposing of Method 4 comprises: shining light through a mask (so as to provide Method 5). Preferably, said exposing of Method 5 comprises: generating ultraviolet light from a light source; and passing the ultraviolet light through the mask wherein light passing through the mask impinges upon the set of the plurality of photoresist-covered conductive areas (so as to provide Method 6). Preferably, Method 3 further comprises etching the fixed photoresist (so as to provide Method 7). Preferably, said depositing the light emitting substance on the exposed areas of the screen according to Method 1 comprises: cataphoretic deposition (so as to provide Method 8). Preferably, said removing the photoresist from the unfixed set according to Method 1 comprises: rinsing with developer. Preferably, said light emitting substance of Method 1 comprises phosphor.

According to another embodiment of the invention, a system (System 11) is provided for producing high resolution displays. System 11 comprises: a depositor of a grille having a set of holes formed therein applied to the screening surface that exposes a first set of exposed areas of the screening surface; an applicator of a layer of photoresist to the grille and the first set of exposed areas of the screening surface, whereby a plurality of photoresist-covered screening surface areas are defined; a fixer of one set of the plurality of photoresist-covered screening surface area, whereby a fixed set of areas is defined, and an unfixed set of areas is defined; a remover of the photoresist from the unfixed set, whereby a second set of exposed areas are defined; and a depositor of a light emitting substance in the second set of exposed areas; and a plasma etcher of the fixed set of photoresist.

Preferably, said depositor of a light emitting substance on the second set of exposed areas according to System 11 comprises deposition of a first color light emitting substance that defines a first deposit area, and said plasma etcher of the fixed set according to System 11 defines an exposed-conductive area, and System 11 further comprises: an applicator of a layer of photoresist to the entire substrate; a fixer of those portions of the photoresist covering the areas where deposition is not wanted; a remover of the unfixed portion of the photoresist covering; and a depositor of a second color light emitting substance on the exposed-conductive area (so as to provide System 12). Preferably, the fixer of System 12 comprises a light source (so as to provide System 13). Preferably, the light source of System 13 comprises an ultraviolet light source (so as to provide System 14). Preferably, said light source of System 14 further comprises: a mask through which the ultraviolet light shines onto a portion of the photoresist to be fixed (so as to provide System 15). Preferably, said depositor of a light emitting substance on the exposed-conductive area of System 12 comprises: a cataphoretic bath (so as to provide System 16). Preferably, said cataphoretic bath of System 16 comprises:

a voltage source connected between the conductive coating and an anode, having disposed there between an electrolytic fluid; the electrolytic fluid comprising: light-absorptive, non-conductive material, chosen from a group consisting of: Manganese carbonate, cobalt oxide black, and iron oxides with cobalt oxides; and the voltage applied by the voltage source being between about 100 volts and about 600 volts, applied for between about 1 minute and about 10 minutes (so as to provide System 17). Preferably, said remover of the photoresist from the unfixed set according to System 11 comprises: a developer (so as to provide System 18). Preferably, said light emitting substance of System 11 comprises phosphor (so as to provide System 19).

While the above techniques have been disclosed in the context of producing high resolution and/or small surface area FEDs, it should be understood that FEDs of lower resolution and/or larger surface area can be produced using the same or alternative techniques. For example, while deposit of the black matrix material and phosphor by electrophoresis is preferred in the context of high resolution and/or small surface area FEDs, other techniques may be employed if the FED is not constrained in this manner. To this end, the phosphor may be deposited by techniques including (but not limited to) slurry settling, dusting, phototacky and electrostatic dusting.

The following examples are offered by way of illustration, not limitation.

EXAMPLES

Example 1

Electrophoresis Solution Containing a Suspension of Black Matrix Material

In this example, an electrophoresis solution containing a black matrix material, boron carbide, is disclosed. An electrophoresis solution is made by combining the following components:

Boron carbide (d50=1.5 microns) 0.05 wt %

De-ionized water 1.00 wt %

Lanthanum nitrate 0.02 wt %

Isopropanol 98.93 wt %

Anticoagulant (e.g., glycerol), which is an optional ingredient, may be added to, or substituted for, the de-ionized water. When present, the anticoagulant is generally present in an amount of about 1 to about 5 times the amount of the solid components in the electrophoresis solution.

Example 2

Deposit of Black Matrix Material on FED Faceplate

This example discloses the electrophoretic deposition of a black matrix material in the manufacture of an FED faceplate.

The electrophoresis solution of Example 1 is contained within an electrophoretic chamber sized to permit complete immersion of the faceplate, the faceplate having been patterned with a photoresist. The chamber is preferably made from electrically non-conductive material, and the electrophoresis solution generally has a conductivity less than 2 micromhos/cm. Electrophoresis requires a voltage across a submerged anode and cathode pair to produce deposition. Typically, the faceplate is employed as the cathode and a dummy aluminum or stainless steel electrode is used for the anode. The anode is similar in size to the electrode. Typically, 200 volts at 0.1–0.2 mA/cm is applied across the cathode-anode pair for 5–6 minutes to achieve the desired deposition of the black matrix material on the exposed surfaces of the faceplate.

EXAMPLE 3

Preparation of Faceplate and FED

After deposit of the black matrix material, the photoresist is stripped away. A new photoresist coating is then applied, softbaked, exposed (to pattern the faceplate for deposit of the phosphor), and developed. The phosphor is then deposited by electrophoresis within the exposed areas of the faceplate. This photoresist is subsequently stripped away, and a colloidal silica or silicate binder applied to the black matrix material and phosphor. The faceplate is then baked at a temperature ranging from 650° C. to 700° C. at atmosphere for a period of time ranging from 30 minutes to 3 hours, followed by a vacuum bake at a temperature of 500° C. for a period of time ranging from 1 hour to 12 hours. When this process is done for color (i.e., three phosphor) screens, the phosphor steps occur three times. Each time, a third of the pixels are exposed for phosphor deposition in the appropriate pattern.

The resulting faceplate is then used in the assembly of an FED. Due to the black nature of the matrix material, the FED screen has high contrast between the phosphor pixels. In short, the dark outline around each pixel causes the individual pixels to stand out. In addition, the black matrix material absorbs ambient light, this reducing glare and reflection of the faceplate, as well as reducing any internal reflections between the FED faceplate and emitter panel.

From the foregoing it will be appreciated that, although specific embodiments of the invention have been disclosed herein for the purpose of illustration, various modifications may be made without deviating from the spirit and scope of the invention. Accordingly, the invention is not limited except as by the appended claims.

What is claimed is:

1. A faceplate in a field emission display, prepared according to a method comprising depositing on at least a portion of the faceplate a black matrix material selected from boron carbide, silicon carbide, titanium carbide, vanadium carbide and mixtures thereof.

2. The faceplate of claim 1 wherein the black matrix material is deposited electrophoretically.

3. The faceplate of claim 1 wherein the faceplate is patterned with a photoresist and the black matrix material is deposited within an exposed area of the photoresist.

4. The faceplate of claim 1, wherein the method further comprises the step of depositing phosphor on at least a portion of the faceplate not deposited with the black matrix material.

5. The faceplate of claim 4 wherein the faceplate is patterned with a photoresist and the phosphor is deposited within an exposed area of the photoresist.

6. The faceplate of claim 4, wherein the method further comprises the step applying a binding agent to the black matrix material and the phosphor.

7. The faceplate of claim 6, wherein the method further comprises the step of baking the faceplate.

8. The faceplate of claim 7 wherein the faceplate is baked at a temperature ranging from 650° C. to 700° C. at atmosphere for a period of time ranging from 10 minutes to 3 hours.

9. The faceplate of claim 7 wherein the faceplate is baked at a temperature of about 500° C. under vacuum for a period of time ranging from 1–12 hours.

10. The faceplate of claim 7, wherein the method further comprises the step of assembling a field emission display incorporating the faceplate.

11. A faceplate in a field emission display prepared according to a method comprising:

contacting a faceplate with an electrophoresis solution, wherein the electrophoresis solution comprises a black matrix material selected from boron carbide, silicon carbide, titanium carbide, vanadium carbide and mixtures thereof; and electrophoretically depositing the black matrix material on at least a portion of the faceplate.

12. The faceplate of claim 11 wherein the faceplate is patterned with a photoresist such that the black matrix material is deposited on the faceplate within an exposed area of the photoresist.

13. The faceplate of claim 11 wherein phosphor is subsequently deposited on at least a portion of the faceplate not deposited with the black matrix material.

14. The faceplate of claim 13 wherein the black matrix material and phosphor are coated with a binder.

15. The faceplate of claim 14 wherein the faceplate is baked.

16. The faceplate of claim 15, wherein the method further comprises the step of assembling a field emission display incorporating the faceplate.

17. The faceplate of claim 11 wherein the black matrix material is present in the electrophoresis solution in an amount ranging from about 0.03 to 1.0 wt %.

18. The faceplate of claim 11, wherein the electrophoresis solution further comprises an electrolyte in an amount of about 0.001–0.2 wt %.

19. The faceplate of claim 11, wherein the electrophoresis solution further comprises an anti-agglomerating agent in an amount ranging from about 0.03 to 1.0 wt %.

20. The faceplate of claim 11, wherein the electrophoresis solution further comprises water.

21. The faceplate of claim 20 wherein water is present in the solution in an amount up to about 2 wt %.

22. A faceplate in a field emission display, comprising a black matrix material deposited on at least a portion of the faceplate, wherein the black matrix material is selected from boron carbide, silicon carbide, titanium carbide, vanadium carbide and mixtures thereof.

* * * * *